United States Patent
Wakamatsu

[19]

[11] Patent Number: 5,886,529
[45] Date of Patent: Mar. 23, 1999

[54] IMPEDANCE MEASURING DEVICE

[75] Inventor: Hideki Wakamatsu, Hyogo, Japan

[73] Assignee: Hewlett-Packard Company, Palo Alto, Calif.

[21] Appl. No.: 826,960

[22] Filed: Apr. 9, 1997

[30] Foreign Application Priority Data

Apr. 18, 1996 [JP] Japan ................................. 8-096838

[51] Int. Cl.⁶ .................................................. G01R 27/26
[52] U.S. Cl. ........................ 324/601; 324/130; 702/124
[58] Field of Search .................................. 324/130, 601, 324/99 D; 364/483, 571.51

[56] References Cited

U.S. PATENT DOCUMENTS

| | | | |
|---|---|---|---|
| 4,337,517 | 6/1982 | Nickel et al. ............................. | 364/571 |
| 4,667,153 | 5/1987 | Doyle ...................................... | 324/130 |
| 4,751,654 | 6/1988 | Lyrra ...................................... | 324/601 |
| 5,258,704 | 11/1993 | Germer .................................... | 324/130 |

FOREIGN PATENT DOCUMENTS 2246639  5/1992  United Kingdom .

OTHER PUBLICATIONS

"High Performance Digital Multimeter with 'Internal Calibration'", Goeke, W., Proc. Instrumentation and Measurement Conf. 20 Apr. '88, pp. 292–296.

European Search Report, EP 97 30 2511, 11 Sep. 1997.

*Primary Examiner*—Maura Regan

[57] ABSTRACT

In the prior art multiple calibration standards are required to calibrate multiple measurement ranges in an impedance measuring apparatus and calibration is time-consuming. An impedance measuring apparatus incorporating the invention is provided with a reference resistor part and the relative error among the measurement ranges is corrected automatically using the reference resistor. A single range is calibrated using a single impedance standard so that absolute calibration is carried out for all of the ranges. When correcting the relative error for the various ranges via the reference resistor, measurement takes place at a value smaller than for the full scale of the range and errors caused by resolution, linearity and the S/N ratio are propagated throughout the ranges and accumulate. To prevent this, a signal normalizing part is placed on the front section of an A-D converter and another signal normalizing part is placed on the front section of a frequency converter.

10 Claims, 4 Drawing Sheets

IMPEDANCE MEASURING DEVICE

FIELD OF THE INVENTION

The present invention relates to an impedance measuring apparatus.

DESCRIPTION OF THE INVENTION PRIOR ART

FIG. 4 is a block diagram indicating the principle lying behind a typical prior art impedance measuring apparatus. The impedance measuring apparatus is provided with test signal source 51, current to voltage converter part 30, analog to digital (A-D) converter part 70, switch 71 and an arithmetic and control part (not shown in figure) for control thereof.

The basic principle underlying the measuring process is as follows. Test signal is applied from test signal source 51 to one terminal on a device under test (DUT) 10 via measurement terminal 11. Another terminal on DUT 10 is connected to current to voltage converter 30 via measurement terminal 12. Current to voltage converter part 30 is provided with an amplifier 31, a switch 35 and range resistors 32, 33 and 34. Range resistors 32, 33 or 34 are selected by switch 35 and are connected between the input and output terminals on amplifier 31. As a result, the input of current to voltage converter part 30 becomes equivalent to the ground potential by means of a feedback circuit which is made up of amplifier 31 and the resistors. In addition, the output becomes a voltage which is proportional to the input current.

The input of current to voltage converter part 30, that is, measurement terminal 12, becomes ground potential. As a result, the output from test signal source 51, that is, the voltage from measurement terminal 11, becomes equivalent to the voltage between both terminals on DUT 10.

As a result, when switch 71 is connected as indicated in FIG. 4 to Vch and the test signal source is selected, A-D converter 70 measures the voltage of the DUT. Meanwhile, the output voltage from current to voltage converter part 30 is a voltage which is proportional to the current flowing through DUT 10. As a result, when switch 71 is connected to the Ich side and is used to select the output voltage from current to voltage converter part 30, A-D converter 70 measures the current flowing through DUT 10.

In the configuration indicated in FIG. 4, the test voltage is constant, the current is proportional to the admittance of the DUT and the full scale of the measurement range is determined by the admittance. As a result, it is more appropriate to specify the measurement range using "admittance" than using "impedance".

As indicated previously, measured admittance value Ydut of the DUT is the product of the conductance Gi of the range resistors (32, 33 or 34) and the ratio I/V of I obtained by connecting switch 71 to the Ich terminal and the value V obtained by connecting switch 71 to the Vch terminal and carrying out A-D conversion. In other words:

$$Y\text{dut} = Gi \cdot I/V \tag{1}$$

Here, i indicates the name of the range. This is calculated using the arithmetic and control unit.

Since the current flowing through the DUT greatly changes due to the impedance value (admittance value) of the DUT, range resistors 32, 33 and 34 are switched using switch 35 and the current is converted and normalized to a voltage having a magnitude which can be measured with a high degree of accuracy by using the A-D converter 70.

Although there are three measurement ranges in FIG. 4, it should by no means be construed that the number of measurement ranges is limited to three.

In the impedance measuring apparatus including multiple measurement ranges switched, calibration is carried out by multiple standards (working standards). The value of the respective standards (working standards) is selected so that they provide a full scale for the A-D converter 70 in the corresponding range. This means that the selection is made so that the optimum measured SN ratio can be obtained in each of the ranges. The corrected measured value is obtained by using the operation in the following formula using the correction coefficient Ki obtained by using this calibration.

$$Y\text{dut} = Ki \cdot Gi \cdot I/V \tag{2}$$

The conventional method of carrying out calibration for each measurement range which provided as many standards as there were ranges involved a large number of standards. The costs and management associated with such a method as well as the number of steps involved in the calibration process were burdensome both for the manufacturer and for the user.

Therefore, an apparatus or a function which could be calibrated by using a single standard was ideal both for the manufacturer and the user. However, when the prior art impedance measuring apparatus was calibrated using a single standard, calibration could be carried out suitably only within a certain range. There was, however, a need for calibration in other ranges, under conditions which did not fulfill even 1% of the full scale. Needless to say, this type of calibration method could not be applied to an impedance measuring apparatus which covered a wide measurement range.

Problems Which the Present Invention Attempts to Resolve:

An impedance measuring apparatus requires multiple calibration standards in order to calibrate multiple measurement ranges and a long time is required for this calibration process.

An object of the present invention is to provide an impedance measuring apparatus capable of simply and rapidly carrying out a calibration of multiple impedance measurement ranges by using a single impedance standard.

SUMMARY OF THE INVENTION

In the basic means of the present invention, the impedance measuring apparatus is provided with a group of reference impedances. The relative error between the measurement ranges is automatically corrected internally using the reference impedances. By calibrating a single range using a single impedance standard, absolute calibration of all of the ranges can be carried out.

The aforementioned basic means corrects the relative error among the measurement ranges by the mediation of the reference impedance. As a result, a measurement at a value which is smaller than the full scale of the range is inevitable. As a result, errors resulting from the resolution, linearity and the SN ratio are propagated throughout the ranges and accumulate. In order to prevent this, a signal normalizing part is placed in front of the A-D converter and frequency converter where such errors arise, thus avoiding measurement at a value which is smaller than the full scale.

Explanation of Numerals

Figure 1:
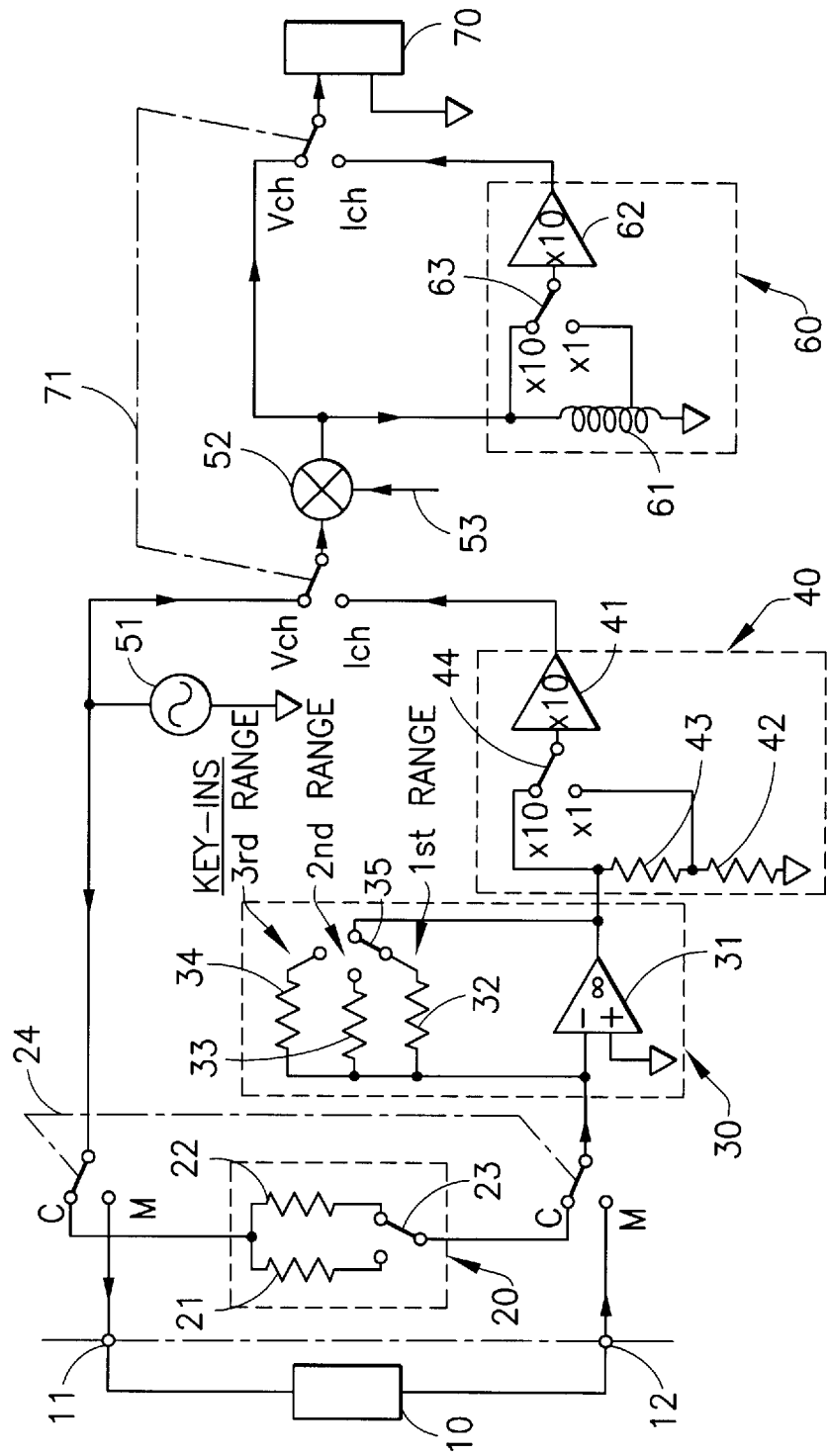
FIG. 1 indicates a third practical embodiment of the present invention.

10: Device under test
11: Measurement terminal
12: Measurement terminal
20: Reference resistor part
21: Resistor
22: Resistor
23: Switch
24: Switch
30: Current to voltage converter
31: Amplifier
32: First range resistor
33: Second range resistor
34: Third range resistor
35: Switch
40: Signal normalizing part
41: Amplifier
42: Resistor
43: Resistor
44: Switch
51: Test signal source
52: Frequency converter
53: Local signal
60: Signal normalizing part
61: Transformer
62: Amplifier
63: Switch
70: A-D converter
71: Switch

DETAILED DESCRIPTION OF A PREFERRED EMBODIMENT OF THE INVENTION

Figure 2:
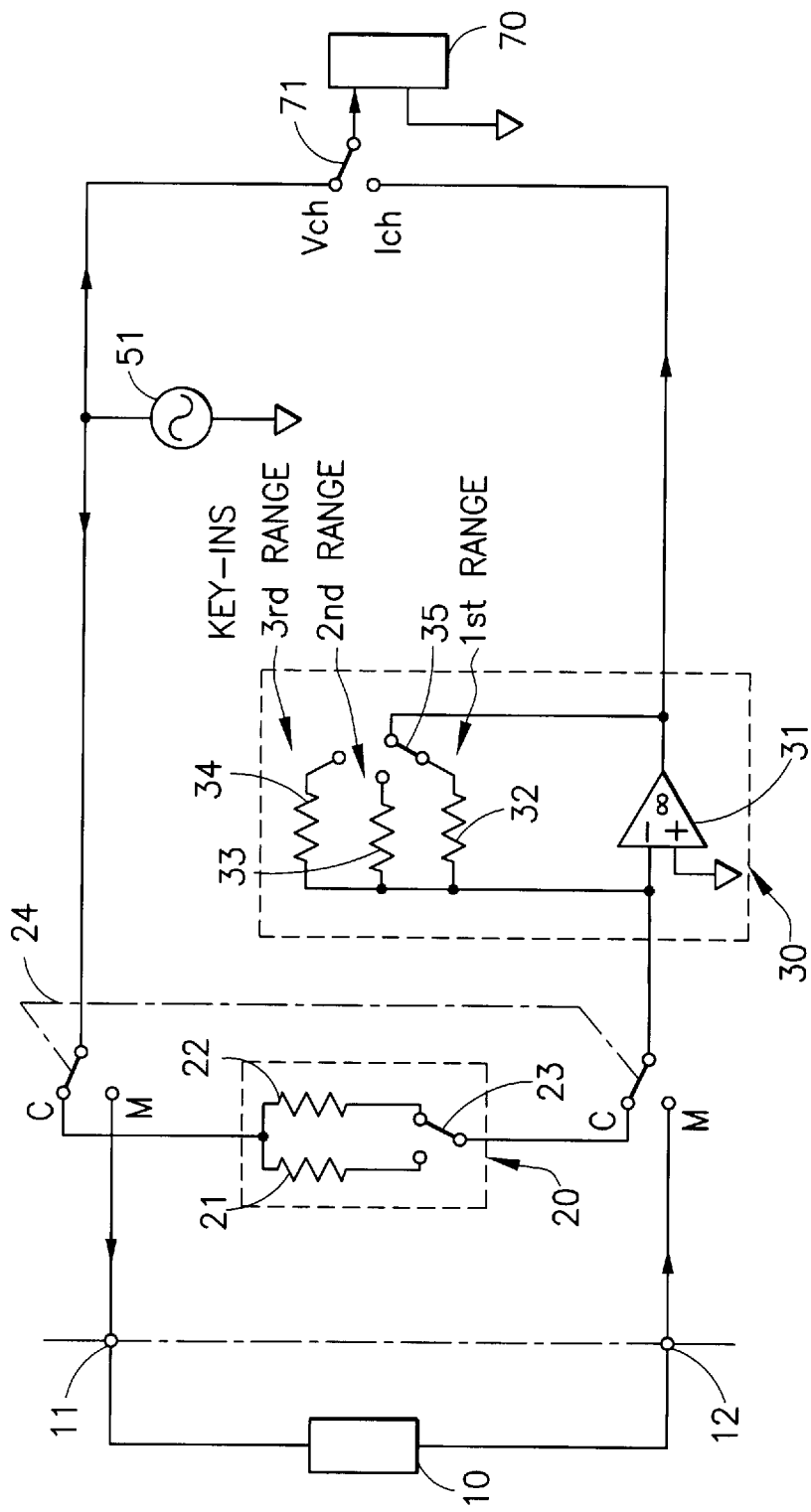
FIG. 2 indicates a first practical embodiment of the present invention.
Figure 4:
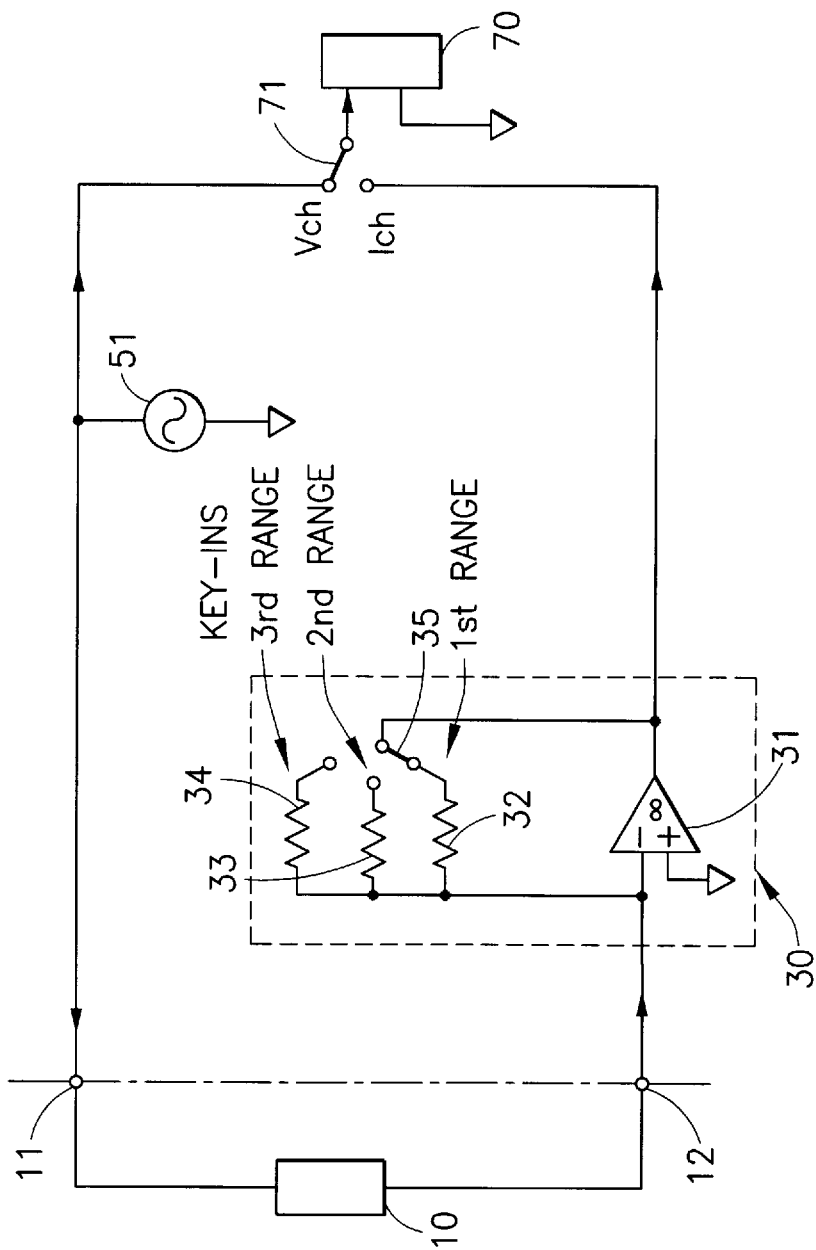
FIG. 4 indicates an example of the prior art.

FIG. 2 indicates the configuration of the above-mentioned basic means which is used as the first practical embodiment of the present invention. The reference numerals are the same as for the configuration elements of the prior art apparatus indicated in FIG. 4.

The first practical embodiment provided here is an example which uses a resistor as the reference impedance for measuring the relative error among the ranges. Unlike the prior art indicated in FIG. 4, there are added reference resistor part 20 and switch 24 which is switched between reference resistor part 20 and DUT 10. In addition, there is no need to calibrate resistors 21 and 22 in reference resistor part 20. Nor is there any need for long-term stability.

In order to facilitate understanding, we shall set the number of measurement ranges at three, making an allotment for each range at 10-fold intervals and specify 100 mS for the full scale of the first range, 10 mS for the full scale of the second range and 1 mS for the full scale of the third range. However, it should by no means be construed that the present invention is limited to these values.

The method for calibrating the absolute error of all of the ranges by measuring the relative error among the ranges is as follows. It is carried out by controlling from the arithmetic and control unit (not shown in the figure).

First, we start by connecting switch 24 to side C (reference resistor part side) as indicated in FIG. 2, measuring the reference resistor part 20 and calibrating the relative error among the ranges. 10 mS reference resistor 21 is selected using switch 23. Switch 35 is placed in the 100 mS range (first range) and the reference resistor 21 is measured at an admittance scale of 10%.

Next, we leave switch 23 selecting 10 mS reference resistor, place switch 35 in the 10 mS range (second range) and measure the full scale.

With a measured value of Y1 for the former and Y2 for the latter, K12 which is the ratio of correction coefficient K1 and K2 in formula (2), is obtained from the following formula.

$$K12 = K1/K2 = Y2/Y1 \qquad (3)$$

Next, K23 (=K2/K3) can be found by selecting 1 mS reference resistor 22 using switch 23 and carrying out measurement in the 10 mS range (second range) and the 1 mS range (third range).

The relative error among all of the ranges can be determined in this way. Switch 24 is brought down to side M (measurement terminal side) and the calibration standard is measured in the appropriate range so that calibration for the absolute value of all of the ranges can be completed. For example, when Y std is measured in the second range, we get the following.

$$K2 = Y\text{std}/(G2 \cdot (I/V)$$

$$K1 = K12 \cdot K2$$

$$K3 = K2/K23$$

As indicated previously, by successively switching the reference impedances which are built into the impedance measuring apparatus, all of the ranges can be automatically calibrated by controlling from the arithmetic and control part.

Furthermore, calibration can be carried out even in a sequence opposite that used for calibrating the ranges mentioned previously. This means first evaluating the reference resistor at full scale and then calibrating 10% of the range using the reference resistor. A sequence whereby calibration is carried out first using the standard resistor may also be adopted.

In the first practical embodiment of the present invention indicated in FIG. 2, measurement at 10% of full scale (hereinafter referred to in abbreviated form as "10% measurement") is such that the measuring accuracy declines compared to when full scale is used. As a result, errors are propagated throughout the ranges as the above-mentioned calibration and evaluation processes are repeated and these errors accumulate, thus making the method defective. The primary cause of the errors is the deterioration of the signal to noise (SN) ratio, the resolution and the linearity when 10% measurement is carried out.

The noise encountered is made up of thermal noise and "shot" noise of each of the elements making up the circuit and occurs in superimposed fashion on the signals. In the 10% measurement, the SN ratio is $1/10$ that of full scale. According to the statistical principles of Gaussian noise, a measurement time which is ten times that of full scale is required to obtain a measurement reproducibility (measurement error standard deviation) equal to that at full scale. When the signals are weak, the quantizing step size of the A-D converter as well as its un-uniformity adversely affect the measuring resolution and linearity. When the 10% measurement is used, following a simple model, the error resulting from these multiplies tenfold.

As a result; in the first practical embodiment, an increase in the error is unavoidable even if the calibration time is increased. This practical embodiment of the invention is not suitable for calibration of an impedance measuring apparatus having a high precision measurement or a wide measurement range.

Figure 3:
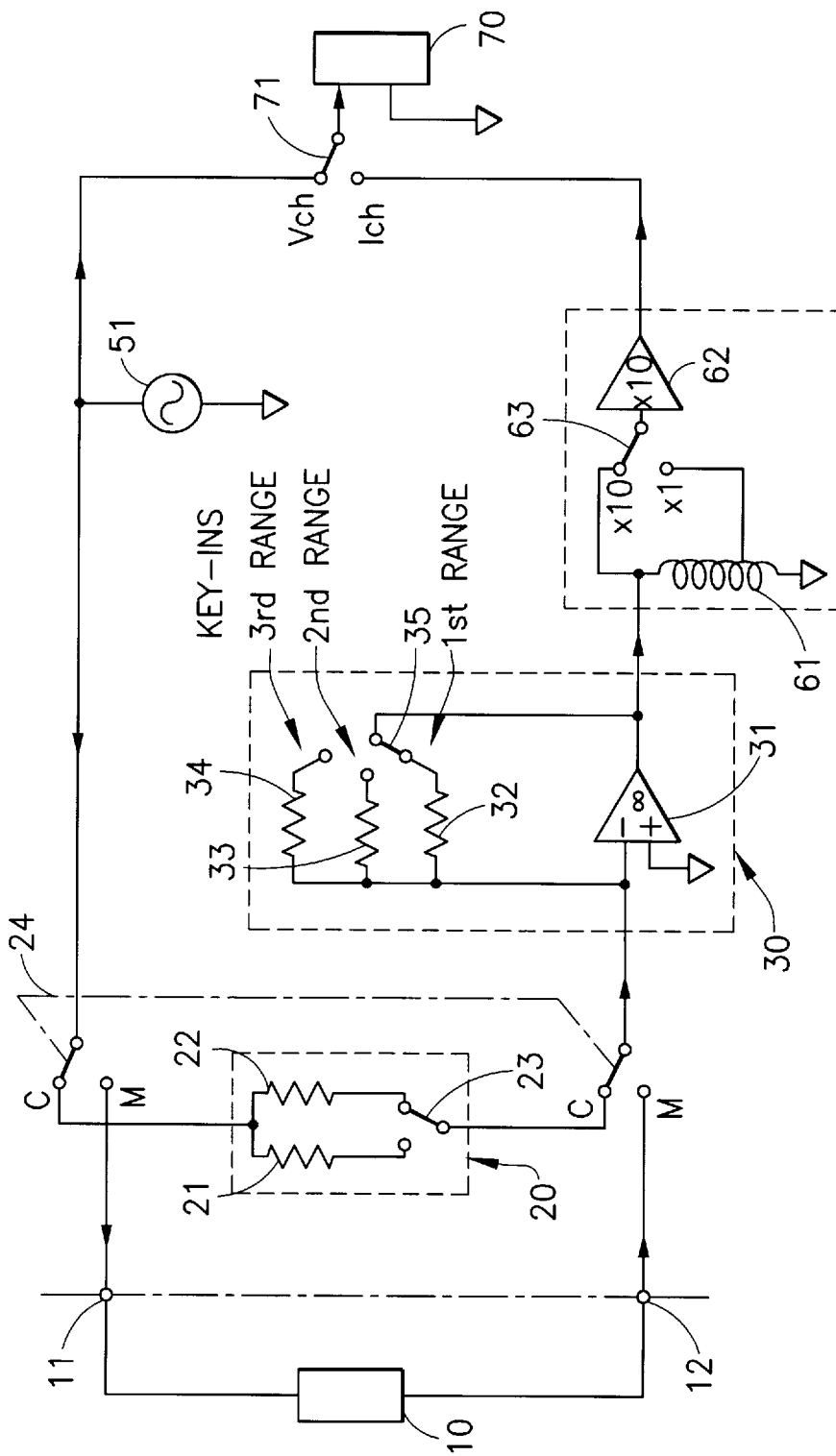
FIG. 3 indicates a second practical embodiment of the present invention.

FIG. 3 indicates a second practical embodiment of the means used to resolve the problems encountered in the first practical embodiment of the present invention. The sequence for calibrating reference resistor part 20 and the errors among the ranges is the same as for the first practical embodiment. Here too we shall specify three measurement ranges and a tenfold interval for the impedance undertaken for each of the ranges in order to facilitate understanding of the practical embodiment. It should by no means be construed, however, that the number of measurement ranges, the intervals, and impedances are restricted to these.

In order to eliminate any accumulation of errors resulting from deterioration of the resolution and the linearity of the A-D converter 70, we shall attach a signal normalizer 60 to the front stage of A-D converter 70. Signal normalizer 60 is provided with transformer 61, amplifier 62 and switch 63. In the example indicated in FIG. 3, transformer 61 is provided with an output terminal and reduces the input voltage to $\frac{1}{10}$ and the gain of amplifier 62 is set at 10. As a result, when switch 63 is used to select x 10, as indicated in FIG. 3, the gain of signal normalizer 60 is increased tenfold. When switch 63 is used to select x 1, the gain of signal normalizer 60 is unity.

When correction for error is made for the various ranges, when the gain of signal normalizer 60 is unity for full scale measurement and tenfold for 10% measurement, the input for A-D converter 70 is normalized to full scale. As a result, the apparent dynamic range for the A-D converter is noticeably improved and any errors caused by deterioration of the resolution and the linearity are eliminated.

In considering the accuracy of the gain of signal normalizer 60, it is not the unity and tenfold values themselves which are important but rather the gain ratio. Since the transformer is capable of carrying out voltage division of the integer ratio at an error of several ppm, the gain of signal normalizer 60 need not be calibrated as long as a transformer is used.

Furthermore, transformer 61 on signal normalizer 60 may be replaced with resistive divider depending on the measuring precision or the measuring frequency of the impedance measuring apparatus.

Next, we shall present a third practical embodiment of the present invention. FIG. 1 indicates an example of a wide frequency band impedance measuring apparatus whose measuring frequency is 100 Hz to 100 MHz.

We shall specify three measurement ranges to facilitate understanding of the device, although it should by no means be construed that the number of possible ranges is restricted to three.

Conventional high frequency band impedance measuring apparatuses are oftentimes realized with superheterodyne systems. In the superheterodyne system, the measuring frequency is mixed with local signals 53 and converted to an intermediate frequency at frequency converter 52. Then, it is measured using an A-D converter 70.

Signal normalizing part 60 is provided at the intermediate frequency stage at the input to A-D converter 70 in order to eliminate any accumulation of errors resulting from deterioration of the resolution and linearity of A-D converter 70. The signal normalizer 60 operates in the same way as signal normalizing part 60 in the second practical embodiment of the present invention.

However, when the heterodyne system is used, the problem involving the SN ratio cannot be resolved solely by attaching signal normalizer 60 to the input of A-D converter 70 mentioned above. When the heterodyne system is used, the SN ratio is usually limited by the dynamic range of frequency converter 52. When 10% measurement is carried out, the SN ratio becomes $\frac{1}{10}$ of that which occurs when a full scale measurement is carried out. 100 times the measurement time as for a full scale measuring action is required to obtain the same standard deviation for measurement error as for full scale measurement.

Thus, if still another signal normalizing part is placed in the test frequency stage on the front section of frequency converter 52 and the gain is set at x 10 during 10% measurement of the calibration for the relative errors between the ranges, it is clear that the SN ratio can be improved. The signal normalizing part 40 indicated in FIG. 1 indicates such a configuration. In the example in FIG. 1, signal normalizing part 40 is provided with a voltage divider made up of resistors 43 and 42, a switch 44 and an amplifier 41. If the gain for 10% measurement is set at tenfold, as was the case for signal normalizing part 60, the noise problem caused by frequency converter 52 can be resolved.

It is not possible, however, to make a voltage divider of a ppm order which does not require calibration within a wide band of 100 Hz to 100 MHz. Therefore, the voltage division ratio for signal normalizing part 40 is to be calibrated in the same way as the impedance range.

For example, if signal normalizing part 40 is switched to x 10 and x 1 with a setting (10% measurement) for measuring 1 mS reference resistor at a 10 mS range, and if signal normalizing part 60 on the intermediate frequency stage is switched in line with this to x 1 and x 10 and measurement is carried out, there is no deterioration in A-D conversion and the accurate gain ratio can be found for signal normalizing part 40.

Despite this, since as usual the S/N ratio is poor in frequency converter 52 with a gain of x 1, a 100-fold measurement time is required to calibrate this signal normalizing part 40. However, even with a 100-fold required calibration time, the following two effects can be obtained for the signal normalizing part 40.

In calibrating an impedance measuring apparatus with N number of measurement ranges, N-1 times is required for 10% measurement. By contrast, 10% measurement required for calibrating signal normalizing part 40 need be carried out only one time so that the calibration time can be shortened.

The second effect comes about from the requirements for correcting the frequency characteristics for the wide frequency band impedance measuring apparatus. When there is more than one range resistor and the values of these cover a wide range, there are great differences in the frequency characteristics in the various ranges due to parasitic capacity and the switching circuit. For that reason, a great number of calibration frequency points are required even assuming that interpolation has been carried out inside the frequency. On the other hand, signal normalizing part 40 can be configured with a simple circuit thus resulting in flat frequency characteristics. The calibration frequency points required to interpolate and correct all of the frequency bands of signal normalizing part 40 may be approximately $\frac{1}{10}$ of that relative to the range.

Above we have presented a practical embodiment of the present invention which resolves the problems encountered in 10% measurement based on an example of a wide band impedance measuring apparatus. The problems with errors encountered in A-D conversion have been resolved and the time required to secure the SN ratio has been shortened. The calibration time which increases two-dimensionally in a combination of range direction and frequency direction has been shortened so that it is virtually one-dimensional.

In the present invention, either before or after calibration for the relative errors among the various ranges has been carried out, a single calibration standard is connected between measurement terminals 11 and 12, this is measured in the appropriate range and absolute calibration is carried out. We shall next discuss the conditions relating to this standard.

It is clear that it is relatively easy to handle the resistor which provides a full scale within a certain range as the calibration standard for a wide frequency band impedance measuring apparatus. Nevertheless, this is by no means restricted to the resistor. If one range is calibrated to an absolute value, the absolute value calibration extends to all of the ranges due to the relative value calibration function. As a result, if "autoranging" is carried out while the frequency "sweeps", a standard capacitor may also be used.

However, it should be understood that in this case, making a finer setting for the gain switching for signal normalizing parts 40 and 60 provides a higher probability of being able at all times to input to A-D converter 70 a voltage which is closer to the full scale thus making it more effective.

Although we have already provided practical embodiments of the present invention, it should by no means be construed that the present invention is restricted to the methods of exhibiting, arranging and disposing the device as well as any other related aspects which are presented here.

As has already been explained, if the present invention is used, an impedance measuring apparatus which is so configured that a wide impedance range is covered by multiple ranges can be calibrated simply and rapidly using a single impedance standard. The present invention is further effective for wide band impedance measuring apparatuses and the type of calibration standard is not limited to either resistor or capacitor.

In addition, it is possible not only to rapidly calibrate or adjust the apparatus when it is being manufactured and shipped, but also the end user may easily recalibrate the apparatus based on his existing standards. The apparatus may also be used practically and effectively compared with conventional one that needs multiple standards, because present apparatus needs only one standard, and improves traceability and consistency among ranges.

I claim:

1. An impedance measuring apparatus for measuring an impedance of a device under test (DUT) through use of a plurality of measurement ranges, said apparatus comprising:

a test signal source;

impedance measuring means;

reference impedance means including a selecting switch and one or more reference impedances, said selecting switch controllable to selectively switch to a reference impedance;

a current to voltage converter including said measurement ranges which are selectively switched in response to an input current level;

switching means for selectively connecting the DUT or a selected reference impedance from said reference impedance means to said test signal source and said current to voltage converter;

signal normalizing means connected to said current to voltage converter for providing a substantially normalized output to said impedance measuring means by selectively switching a gain in response to an output level of said current to voltage converter.

2. The impedance measuring apparatus of claim 1, further comprising;

conversion means coupled between said said signal normalizing means and said impedance measuring means for converting test signal frequencies from said DUT or a selected reference impedance to intermediate signal frequencies.

3. The impedance measuring apparatus of claim 2 further comprising:

another signal normalizing means coupled between said conversion means and said impedance measuring means.

4. The impedance measuring apparatus of claim 1, wherein said signal normalizing means is provided with multiple resistors, switching means and amplification means and which changes a gain of the signal normalizing means by selectively switching of a resistor using said switching means.

5. The impedance measuring apparatus of claim 3, wherein said another signal normalizing means is provided with multiple resistors, switching means and amplification means and which changes a gain of the another signal normalizing means by selectively switching of a resistor using said switching means.

6. The impedance measuring apparatus of claim 1 wherein said signal normalizing means is provided with a transformer, a switching means and an amplification means and which changes the gain of the signal normalizing means by selectively switching said transformer using the switching means.

7. The impedance measuring apparatus of claim 3 wherein said another signal normalizing means is provided with a transformer, a switching means and an amplification means and which changes the gain of the another signal normalizing means by selectively switching said transformer using the switching means.

8. The impedance measuring apparatus of claim 1 wherein the aforementioned reference impedance is a resistor.

9. The impedance measuring apparatus of claim 1, further comprising:

means for evaluating a single reference impedance in a first measurement range and in a second measurement range, and finding a relative error between the first measurement range and second measurement range, and for switching the gain of the signal normalizing means according to the size of the input level of the another signal normalizing means to thereby normalize an output level of the signal normalizing means.

10. The impedance measuring apparatus of claim 3, further comprising:

means for evaluating a single reference impedance in a first measurement range and in a second measurement range, and finding a relative error between the first measurement range and second measurement range, and for switching the gain of the another signal normalizing means according to the size of the input level of the another signal normalizing means to thereby normalize an output level of the another signal normalizing means.

* * * * *